United States Patent
Okumura et al.

(10) Patent No.: US 8,390,121 B2
(45) Date of Patent: Mar. 5, 2013

(54) SEMICONDUCTOR DEVICE AND METHOD OF MANUFACTURE THEREOF

(75) Inventors: Mika Okumura, Tokyo (JP); Yasuo Yamaguchi, Tokyo (JP); Takeshi Murakami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/025,633

(22) Filed: Feb. 11, 2011

(65) Prior Publication Data

US 2011/0303992 A1 Dec. 15, 2011

(30) Foreign Application Priority Data

Jun. 9, 2010 (JP) ................. 2010-131964

(51) Int. Cl.
*H01L 23/482* (2006.01)

(52) U.S. Cl. ........ 257/745; 257/750; 257/753; 257/760; 257/784; 257/E23.134

(58) Field of Classification Search .............. 257/750, 257/784, 745, 753, 760, E23.134
See application file for complete search history.

(56) References Cited

U.S. PATENT DOCUMENTS

| | | | | |
|---|---|---|---|---|
| 6,049,365 A | * | 4/2000 | Nakashima | 349/42 |
| 2007/0031638 A1 | * | 2/2007 | Okumura et al. | 428/141 |
| 2009/0050990 A1 | * | 2/2009 | Aono et al. | 257/415 |

FOREIGN PATENT DOCUMENTS

| | | |
|---|---|---|
| DE | 101 96 531 B4 | 6/2005 |
| DE | 10 2005 028 704 | 12/2006 |
| JP | 63-221630 | 9/1988 |
| JP | 6-104268 | 4/1994 |
| JP | 7-297560 | 11/1995 |
| JP | 2001-119040 | 4/2001 |
| JP | 2006-310508 | 11/2006 |
| JP | 2007-46955 | 2/2007 |
| JP | 2008-89327 | 4/2008 |
| KR | 10-2006-0013678 | 2/2006 |

OTHER PUBLICATIONS

German Office Action issued Jun. 1, 2012, in German Patent Application No. 10 2011 075 365.6 (with English translation).
Korean Office Action issued Sep. 17, 2012, in Korea Patent Application No. 10-2011-0052558 (with English translation).

* cited by examiner

*Primary Examiner* — Minchul Yang
(74) *Attorney, Agent, or Firm* — Oblon, Spivak, McClelland, Maier & Neustadt, L.L.P.

(57) ABSTRACT

A semiconductor device includes a substrate, an element formed on the substrate, a nitride film formed on the substrate, a anti-peel film formed on the nitride film, and a molded resin covering the anti-peel film and the element. The anti-peel film has residual compressive stress.

6 Claims, 7 Drawing Sheets

SEMICONDUCTOR DEVICE AND METHOD OF MANUFACTURE THEREOF

BACKGROUND OF THE INVENTION

1. Field of the Invention

The present invention relates to a semiconductor device including a molded resin and to a method of manufacturing the device.

2. Background Art

Some semiconductor devices include an element, or component, formed on a substrate, and a molded resin covering both the substrate and the element. The molded resin serves to protect the element from external moisture and foreign matter. It should be noted that the molded resin covering the substrate and the element typically extends over the nitride film formed on the substrate or the element, which film serves as a surface protective film. Japanese Laid-Open Patent Publication No. 2006-310508 discloses a semiconductor device including a molded resin over such a nitride film. In this case, the molded resin is preferably in close contact with the nitride film so that there is no space between them.

Nitride films are widely used as surface protective films, since they have superior moisture resistance and mechanical strength. It has been found, however, that since nitride films have high residual tensile stress, the molded resin, if any, covering the films may peel off.

SUMMARY OF THE INVENTION

The present invention has been made to solve this problem. It is, therefore, an object of the present invention to provide a semiconductor device which includes a molded resin over a nitride film serving as a surface protective film and which has a construction preventing the peeling of the molded resin. Another object of the present invention is to provide a method of manufacturing such a semiconductor device.

According to one aspect of the present invention, a semiconductor device includes a substrate, an element formed on the substrate, a nitride film formed on the substrate, a anti-peel film formed on the nitride film, and a molded resin covering the anti-peel film and the element. The anti-peel film has residual compressive stress.

According to another aspect of the present invention, a method of manufacturing a semiconductor device, includes the steps of forming a nitride film on a substrate, forming polysilicon on the nitride film, forming a sacrificial film on the nitride film, the sacrificial film being etchable by hydrofluoric acid, forming a conductor by use of the sacrificial film, removing the sacrificial film with hydrofluoric acid, and molding a resin onto the polysilicon.

Other and further objects, features and advantages of the invention will appear more fully from the following description.

DETAILED DESCRIPTION OF THE PREFERRED EMBODIMENTS

First Embodiment

Figure 1:
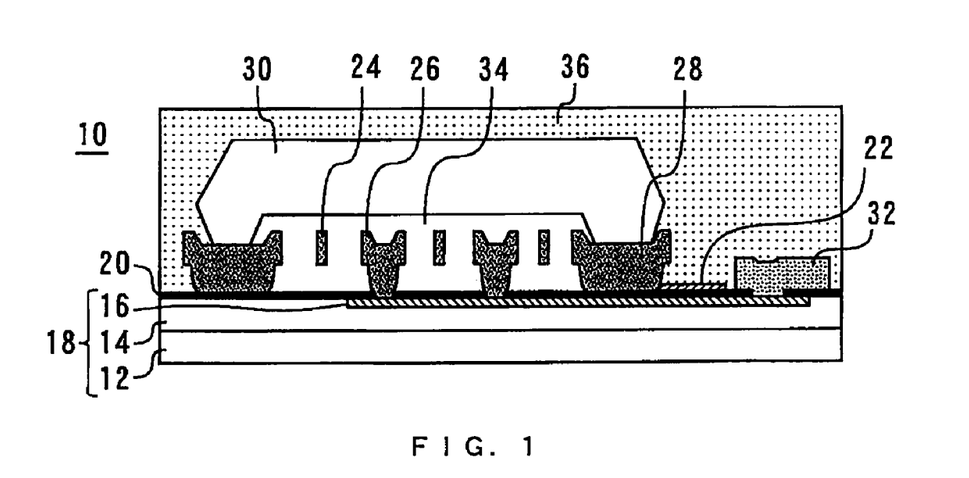
FIG. 1 is a cross-sectional view of a semiconductor device according to a first embodiment of the present invention.

FIG. 1 is a cross-sectional view of a semiconductor device 10 according to a first embodiment of the present invention. This semiconductor device 10 is an acceleration sensor. The semiconductor device 10 includes an Si plate 12. An insulating film 14 is formed over the Si plate 12. A wiring layer 16 is formed in the surface of the insulating film 14. The surface of the insulating film 14 and the surface of the wiring layer 16 form a continuous non-irregular surface. It should be noted that the Si plate 12, the insulating film 14, and the wiring layer 16 may be hereinafter referred to collectively as the substrate 18.

A nitride film 20 is formed on the insulating film 14 and on the wiring layer 16. The nitride film 20 has openings exposing portions of the wiring layer 16. Polysilicon 22 is formed on the nitride film 20. The polysilicon 22 has residual compressive stress.

The semiconductor device 10 includes a moving part 24 also serving as a beam of the acceleration sensor. Supports 26 are formed to support the moving part 24. The supports 26 extend through openings of the nitride film 20 and are in contact with the wiring layer 16. A sealing member 28 is formed on the nitride film 20 and surrounds the moving part 24 and the supports 26. A glass cap 30 is fixed to the top of the sealing member 28. The sealing member 28 and the glass cap 30 define a space 34. The moving part 24 and the supports 26 are encapsulated within the space 34. It should be noted that the moving part 24, the supports 26, the sealing member 28, and the glass cap 30 may be hereinafter referred to collectively as the sensor unit.

Electrode pads 32 are formed on the nitride film 20. The electrode pads 32 are used to make electrical connection to an external device. Portions of the electrode pads 32 extend through openings of the nitride film 20 and are in contact with the wiring layer 16. Therefore, the electrode pads 32 are electrically connected to the supports 26 through the wiring layer 16. A molded resin 36 covers the polysilicon 22, the sensor unit, and the electrode pads 32. The molded resin 36 serves to protect the sensor unit and the electrode pads 32 from moisture and foreign matter.

Figure 2:
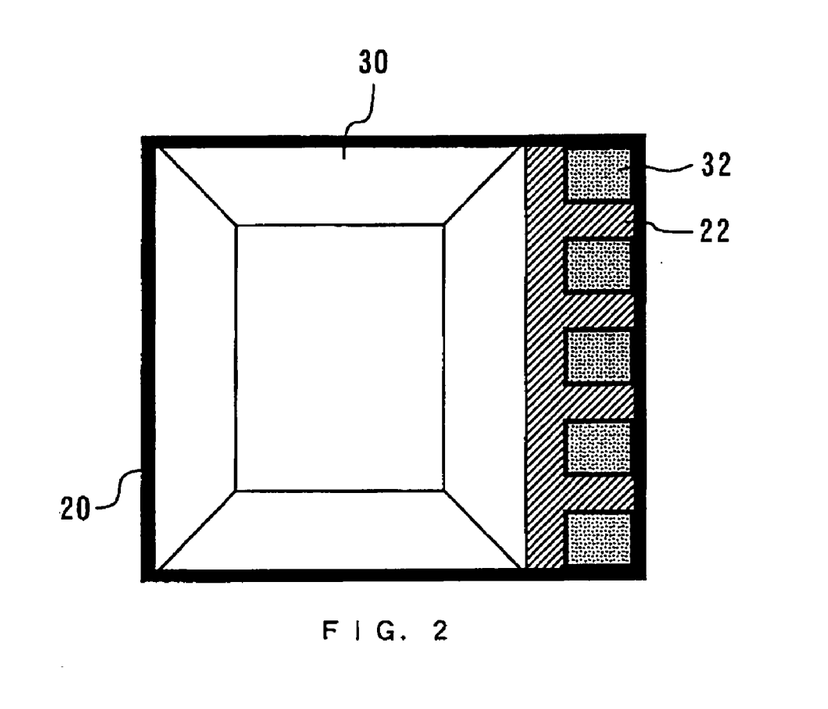
FIG. 2 is a plan view of the semiconductor device of the first embodiment.

FIG. 2 is a plan view of the semiconductor device of the first embodiment. The molded resin 36 is omitted from FIG. 2. As shown in FIG. 2, the polysilicon 22 is formed between the sensor unit and the electrode pads 32 and between the electrode pads 32.

Figure 3:
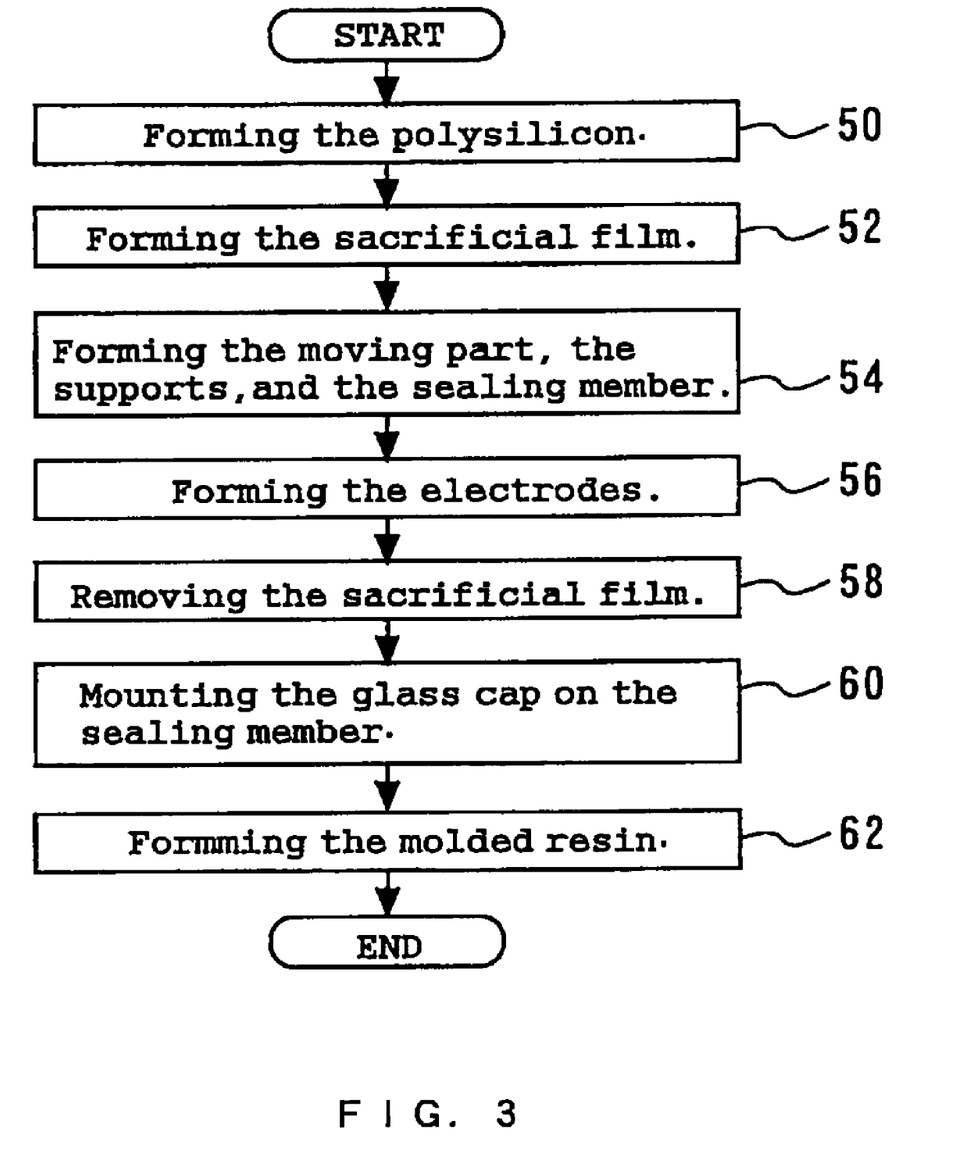
FIG. 3 is a flowchart illustrating a method of manufacturing a semiconductor device in accordance with the first embodiment.
Figure 4:
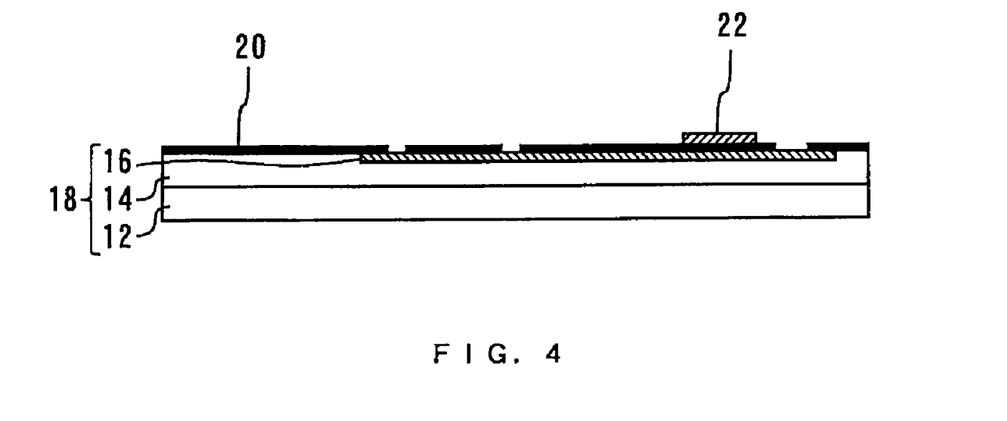
FIG. 4 is a diagram showing the polysilicon after being formed on the nitride film.

FIG. 3 is a flowchart illustrating a method of manufacturing a semiconductor device in accordance with the first embodiment. The method of manufacturing the semiconductor device 10 will be described with reference to FIG. 3. The method begins by forming the polysilicon 22 on the nitride film 20 (step 50). FIG. 4 is a diagram showing the polysilicon 22 after being formed on the nitride film 20.

Figure 5:
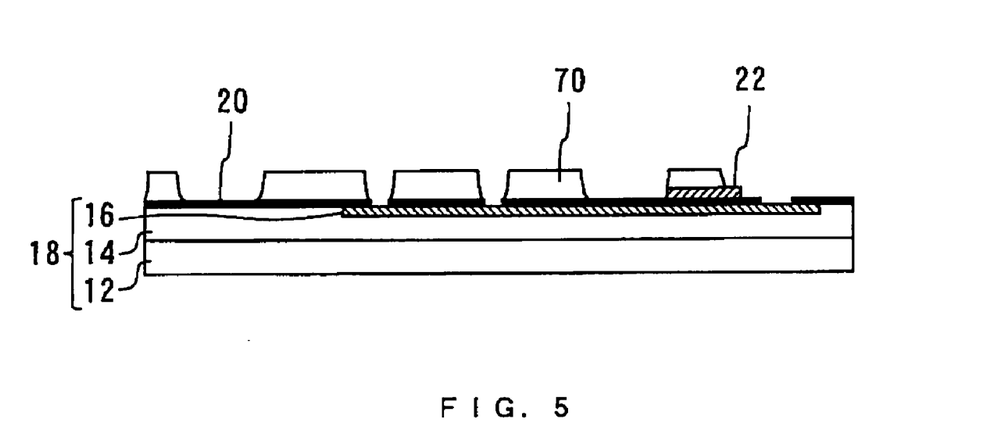
FIG. 5 is a diagram showing the sacrificial film after it is formed.

Next, a sacrificial film 70 is formed on the nitride film 20 (step 52). The sacrificial film 70 is used to define the shapes of the moving part 24, the supports 26, and the sealing member 28. The sacrificial film 70 is removed after use. FIG. 5 is a diagram showing the sacrificial film 70 after it is formed.

Figure 6:
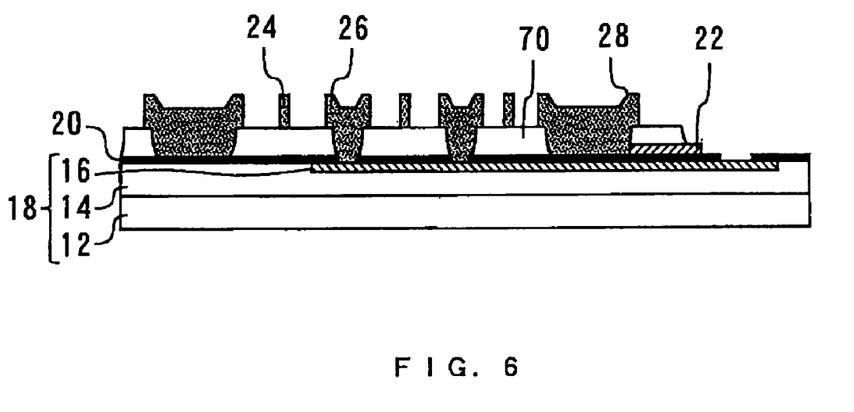
FIG. 6 is a diagram showing the moving part, the supports, and the sealing member after they are formed.
Figure 7:
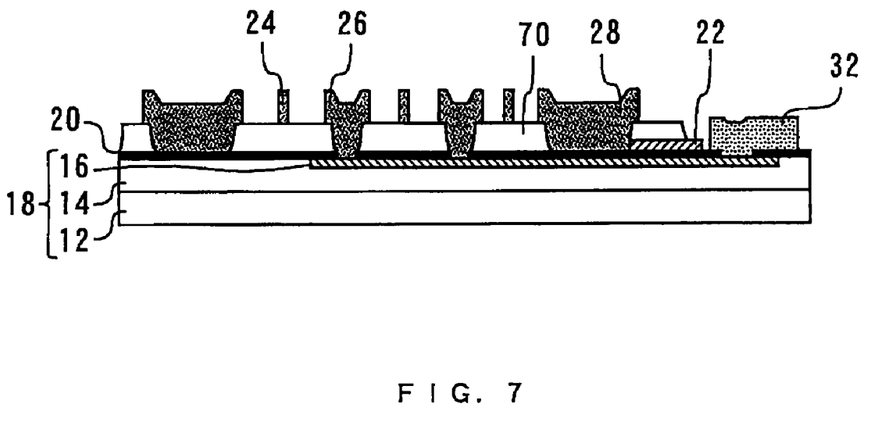
FIG. 7 is a diagram showing the electrode pads after being formed.

The moving part 24, the supports 26, and the sealing member 28 are then formed (step 54). The moving part 24, the supports 26, and the sealing member 28 are conductors. FIG. 6 is a diagram showing the moving part 24, the supports 26, and the sealing member 28 after they are formed. Next, the electrode pads 32 are formed (step 56). FIG. 7 is a diagram showing the electrode pads 32 after being formed.

Figure 8:
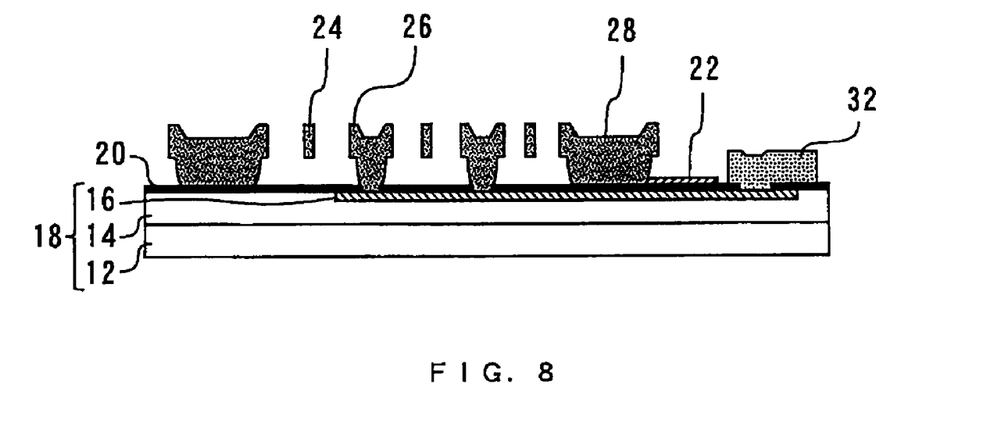
FIG. 8 is a diagram showing the structure after the sacrificial film is etched away by the hydrofluoric acid.

The sacrificial film 70 is then removed (step 58). Specifically, the sacrificial film 70 is removed by etching in hydrofluoric acid. At that time, the polysilicon 22 remains since it is not etched by the hydrofluoric acid treatment. FIG. 8 is a diagram showing the structure after the sacrificial film 70 is etched away by the hydrofluoric acid.

Figure 9:
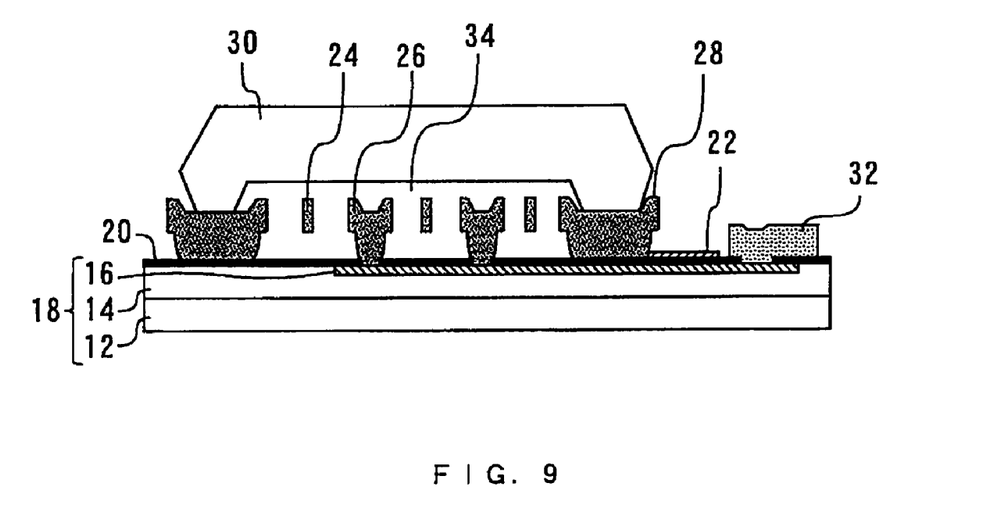
FIG. 9 is a diagram showing the glass cap after being mounted.

Next, the glass cap 30 is mounted on the sealing member 28 (step 60). FIG. 9 is a diagram showing the glass cap 30 after being mounted. Lastly, the molded resin portion 36 is formed (step 62). Thus the method manufactures the semiconductor device 10 shown in FIG. 1.

Incidentally it has been found that since nitride films have high residual tensile stress, the molded resin, if any, covering the films may peel off. However, the construction of the semiconductor device 10 of the first embodiment prevents peeling of the molded resin. Specifically, since the polysilicon 22 is formed on the nitride film 20, the residual tensile stress in the nitride film 20 is offset or reduced by the residual compressive stress in the polysilicon 22. With this arrangement, the molded resin 36 is provided to cover the polysilicon 22, which has relatively low stress. Therefore, this construction of the semiconductor device 10 prevents peeling of the molded resin 36 covering the nitride film 20.

The polysilicon 22 is formed between the sensor unit and the electrode pads 32 and between the electrode pads 32, as described above with reference to FIG. 2. Therefore, in the semiconductor device 10 of the first embodiment, peeling of the molded resin between the sensor unit and the electrode pads 32 is prevented, thus preventing shorting between the sensor unit and the electrode pads 32. Further, peeling of the molded resin between the electrode pads 32 is also prevented, thus preventing shorting between these electrode pads.

In order to prevent peeling of the molded resin, care must also be taken in selecting the coefficients of linear expansion of the molded resin and the materials in contact with the molded resin. In the semiconductor device 10 of the first embodiment, the molded resin 36, the polysilicon 22, and the nitride film 20 have coefficients of linear expansion of approximately 17 ppm/K, 2.5 ppm/K, and 2.8 ppm/K, respectively. Thus the coefficient of linear expansion of the molded resin 36 is close to those of the polysilicon 22 and the nitride film 20 in contact with the molded resin 36, thus eliminating the possibility of peeling of the molded resin 36 due to the difference in coefficient of linear expansion between the molded resin 36 and the adjacent materials.

The polysilicon 22 is not etchable by hydrofluoric acid, allowing the polysilicon 22 to be formed before the hydrofluoric acid treatment. This means that the polysilicon 22 can be formed on the surface of the nitride film 20 right after the formation of the film, when the surface is substantially flat. This facilitates the processing of the polysilicon 22, such as patterning of the polysilicon 22.

Figure 10:
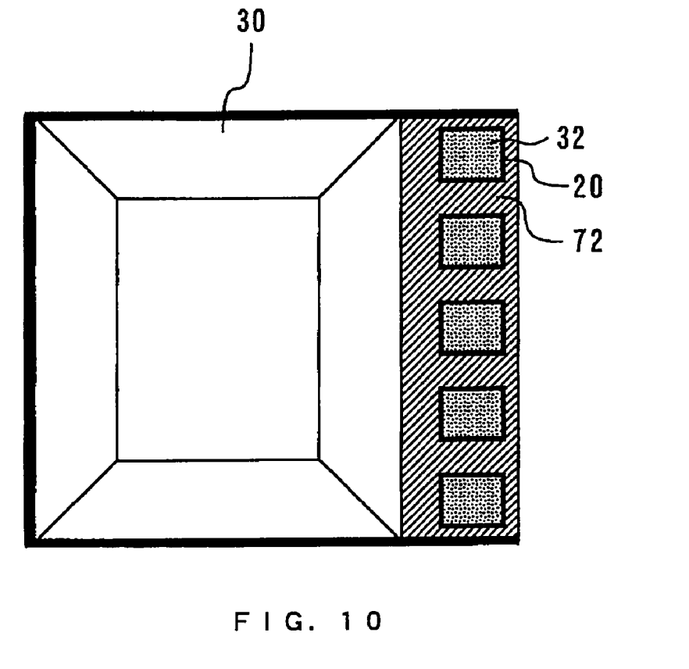
FIG. 10 is a plan view of a variation of the semiconductor device of the first embodiment.
Figure 11:
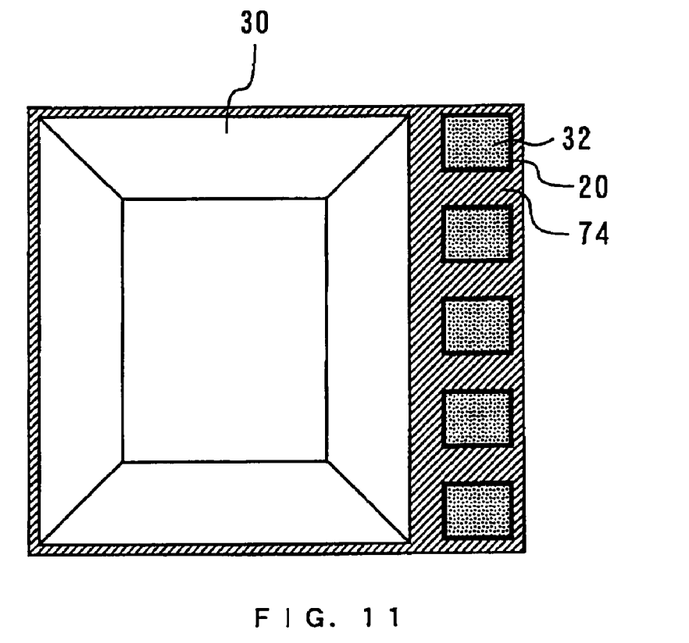
FIG. 11 is a plan view of another variation of the semiconductor device of the first embodiment.

FIG. 10 is a plan view of a variation of the semiconductor device of the first embodiment. In this semiconductor device, polysilicon 72 is formed to surround the electrode pads 32. This prevents peeling of the molded resin around the electrode pads 32. FIG. 11 is a plan view of another variation of the semiconductor device of the first embodiment. In this semiconductor device, polysilicon 74 is formed to surround the sensor unit and the electrode pads 32. This prevents peeling of the molded resin around the sensor unit and around the electrode pads 32.

Although the semiconductor device 10 is an acceleration sensor, it is to be understood that the present invention is not limited to this particular type of semiconductor device. That is, the present invention may be used in a wide variety of other applications where a molded resin is provided over a nitride film. Further, the sensor unit of the first embodiment may be implemented using any suitable device.

Although in the semiconductor device 10 of the first embodiment the polysilicon 22 is used as an anti-peel film for preventing peeling of the molded resin 36, it is to be understood that the present invention is not limited to this particular material. It should be noted that the anti-peel film must have the following properties: having residual compressive stress; having a coefficient of linear expansion close to those of the nitride film and the molded resin; and being not etchable by hydrofluoric acid. Therefore, any type of anti-peel film having these properties may be used. For example, the anti-peel film may be an amorphous silicon film. It should be further noted that the anti-peel film may be made of material etchable by hydrofluoric acid if the film need not be formed before the hydrofluoric acid treatment.

Second Embodiment

Figure 12:
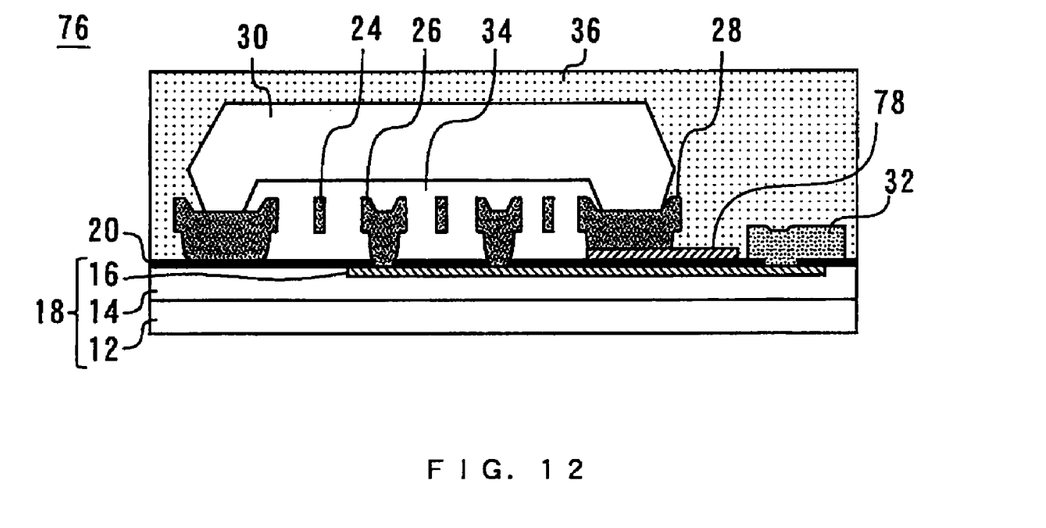
FIG. 12 is a cross-sectional view of a semiconductor device according to a second embodiment of the present invention.

FIG. 12 is a cross-sectional view of a semiconductor device 76 according to a second embodiment of the present invention. The following description of this semiconductor device 76 will be directed only to the differences from the semiconductor device 10 of the first embodiment, since these semiconductor devices have many features in common. The semiconductor device 76 includes polysilicon 78. The polysilicon 78 is formed not only between the sensor unit and the electrode pads 32 but also immediately under the sealing member 28. This means that both the nitride film 20 and the polysilicon 78 are formed between the sealing member 28 and the wiring layer 16.

In the semiconductor device of the second embodiment, even if the nitride film 20 has defects such as pinholes, they are covered by the high resistance polysilicon 78, which is formed after the formation of the nitride film 20. This reliably prevents shorting between the sealing member 28 and the wiring layer 16, although the wiring layer 16 lies directly below the sealing member 28. It should be noted that the semiconductor device 76 is susceptible of alterations which are the same as or correspond to those that can be made to the semiconductor device of the first embodiment.

Thus the present invention makes it possible to prevent peeling of the molded resin covering a nitride film which is formed as a surface protective film.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-131964, filed on Jun. 9, 2010 including specification, claims, drawings and summary, on which the Convention priority of the present application is based, are incorporated herein by reference in its entirety.

What is claimed is:

1. A semiconductor device comprising:
   a substrate;
   an element formed on said substrate;
   a nitride film formed on said substrate;
   an anti-peel film formed on and in direct contact with said nitride film;
   a plurality of electrode pads formed on said substrate; and
   a molded resin covering said anti-peel film, said electrode pads and said element and in direct contact with said anti-peel film;
   wherein said anti-peel film has residual compressive stress and is formed between said element and said plurality of electrode pads and between said plurality of electrode pads;
   wherein said anti-peel film is formed to surround said plurality of electrode pads and said element.

2. The semiconductor device according to claim 1, wherein:
   said element is a sensor unit of an acceleration sensor;
   said substrate has a wiring layer formed therein;
   said sensor unit is electrically connected to said plurality of electrode pads by said wiring layer; and
   said anti-peel film is not etchable by hydrofluoric acid.

3. The semiconductor device according to claim 1, wherein:
   said element includes a conductor formed on said anti-peel film; and
   said substrate has formed therein a wiring layer lying directly below said conductor.

4. The semiconductor device according to claim 1, wherein said anti-peel film is polysilicon or amorphous silicon.

5. A semiconductor device comprising:
   a substrate;
   an element formed on said substrate;
   a nitride film formed on said substrate;
   an anti-peel film formed on and in direct contact with said nitride film;
   a plurality of electrode pads formed on said substrate; and
   a molded resin covering said anti-peel film, said electrode pads and said element and in direct contact with said anti-peel film;
   wherein said anti-peel film has residual compressive stress and is formed between said element and said plurality of electrode pads and between said plurality of electrode pads;
   wherein said element is a sensor unit of an acceleration sensor;
   said substrate has a wiring layer formed therein;
   said sensor unit is electrically connected to said plurality of electrode pads by said wiring layer; and
   said anti-peel film is not etchable by hydrofluoric acid.

6. A semiconductor device comprising:
   a substrate;
   an element formed on said substrate;
   a nitride film formed on said substrate;
   an anti-peel film formed on and in direct contact with said nitride film;
   a plurality of electrode pads formed on said substrate; and
   a molded resin covering said anti-peel film, said electrode pads and said element and in direct contact with said anti-peel film;
   wherein said anti-peel film has residual compressive stress and is formed between said element and said plurality of electrode pads and between said plurality of electrode pads;
   wherein said element includes a conductor formed on said anti-peel film; and
   said substrate has formed therein a wiring layer lying directly below said conductor.

* * * * *